(12) United States Patent
Widdowson (10) Patent No.: US 7,439,895 B1
(45) Date of Patent: Oct. 21, 2008

(54) LINEAR AMPLIFIER USING DIGITAL FEEDFORWARD

(75) Inventor: Scott Widdowson, Ottawa (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 11/617,562

(22) Filed: Dec. 28, 2006

(51) Int. Cl.
*H03M 1/66* (2006.01)
(52) U.S. Cl. .................. 341/144; 455/118; 375/297
(58) Field of Classification Search ............ 341/144, 341/161; 375/296, 297; 455/522, 118
See application file for complete search history.

(56) References Cited

U.S. PATENT DOCUMENTS

| | | | | |
|---|---|---|---|---|
| 6,662,018 B1 * | 12/2003 | Kintis et al. | ................ | 455/522 |
| 6,980,148 B1 * | 12/2005 | Bahai | ................ | 341/161 |
| 2003/0058960 A1 * | 3/2003 | Lee | ................ | 375/297 |
| 2006/0008026 A1 * | 1/2006 | Wood et al. | ................ | 375/296 |
| 2006/0094376 A1 * | 5/2006 | Lee et al. | ................ | 455/118 |

* cited by examiner

*Primary Examiner*—Jean B Jeanglaude
(74) *Attorney, Agent, or Firm*—Conley Rose, P.C.; Rodney B. Carroll; Paul Hashim (57) ABSTRACT

A signal amplification system including a plurality of digital signal inputs coupled to a signal combination devices, wherein each of the plurality of digital signal inputs correspond to a separate digital signal, a signal conversion device coupled to the signal combination device, an up-conversion device coupled to the signal conversion device, and an amplification unit coupled to the up-conversion device. The plurality of signals are combined into a combined digital signal in the signal combination device, the combined digital signal is converted into a combined analog signal in the signal conversion device, the combined analog signal is up-converted into an up-converted analog signal in the up-conversion device, and the up-converted analog signal is amplified into an amplified output in the amplification device. Various systems and methods to combine and amplify digital signals and analog signals.

20 Claims, 14 Drawing Sheets

LINEAR AMPLIFIER USING DIGITAL FEEDFORWARD

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

FIELD OF THE INVENTION

The present invention relates generally to linear signal amplification and, more particularly, to a device and method for increasing the linearity of a wireless transmitter while minimizing the impact on efficiency.

BACKGROUND OF THE INVENTION

Wireless devices use Radio Frequencies (RF) to transmit information. For example, cell phones use amplified RF to transmit voice data to base stations, which allow signals to be relayed to communications networks. Other existing wireless communication devices include Bluetooth, HomeRF and WLAN. In a conventional wireless device, the power amplifier consumes most of the power of the overall wireless system. For systems that run on batteries, a power amplifier with a low efficiency results in a reduced communication time for a given battery size. For continuous power systems, a decrease in efficiency results in increased power usage and heat removal requirements, which may increase the equipment and operating costs of the overall system.

One of the problems with existing amplification systems is the difficulty involved in meeting linearity requirements within the guidelines of existing standards. For instance, combining several signals while remaining within linearity requirements, such as GSM requirements, has been problematic in the absence of expensive components. Systems and methods are needed that enable the combination of signals in a cost effective and linear manner.

SUMMARY OF THE INVENTION

In one embodiment, a signal amplification system is disclosed which comprises a plurality of digital signal inputs coupled to a signal combination devices, a signal conversion device coupled to the signal combination device, an up-conversion device coupled to the signal conversion device, and an amplification unit coupled to the up-conversion device. In this embodiment, the plurality of signals are combined into a combined digital signal in the signal combination device, the combined digital signal is converted into a combined analog signal in the signal conversion device, the combined analog signal is up-converted into an up-converted analog signal in the up-conversion device, and the up-converted analog signal is amplified into an amplified output in the amplification device.

In another embodiment, a method of amplifying a plurality of input signals is disclosed which may comprise converting a plurality of digital signals to a plurality of analog signals, combining the plurality of analog signals into a combined analog signal, preparing the combined analog signal for amplification, and amplifying the prepared combined analog signal.

In another of the disclosed embodiments, a system for amplification is disclosed which comprises a plurality of digital to analog conversion devices with a plurality of digital signals inputs coupled to a signal combiner, a conversion mixer coupled to the signal combiner, and an amplifier coupled to the conversion mixer. In this embodiment, the plurality of digital signals are converted into a plurality of analog signals, the plurality of analog signals are combined into a single analog signal, the analog signal is converted in the conversion mixer onto a carrier frequency, and the converted analog signal is amplified.

Other aspects and features of the present invention will become apparent to those ordinarily skilled in the art upon review of the following description of specific embodiments of the invention in conjunction with the accompanying figures.

DETAILED DESCRIPTION OF THE PREFERRED EMBODIMENTS

It should be understood at the outset that although an exemplary implementation of one embodiment of the present disclosure is illustrated below, the present system may be implemented using any number of techniques, whether currently known or in existence. The present disclosure should in no way be limited to the exemplary implementations, drawings, and techniques illustrated below, including the exemplary design and implementation illustrated and described herein, but may be modified within the scope of the appended claims along with their full scope of equivalents. It is further understood that as used herein, terms such as "coupled", "connected", "electrically connected", "in signal communication", and the like may include direct connections between components, indirect connections between components, or both, as would be apparent in the overall context of a particular embodiment. The term "coupled" is intended to include, but not be limited to, a direct electrical connection. The terms transmit, transmitted, or transmitting is intended to include, but not be limited to, the electrical transmission of a signal from one device to another. In some embodiments, the present disclosure also contains embodiments directed at waveforms of a complex nature (real and imaginary components) as commonly used in digital modulation schemes such as Quadrature Phase-shift Keying (QPSK) and 16-State Quadrature Amplitude Modulation (16QAM). In some other embodiments, the present disclosure also contains embodiments directed to systems employing scalar signals.

Figure 1:
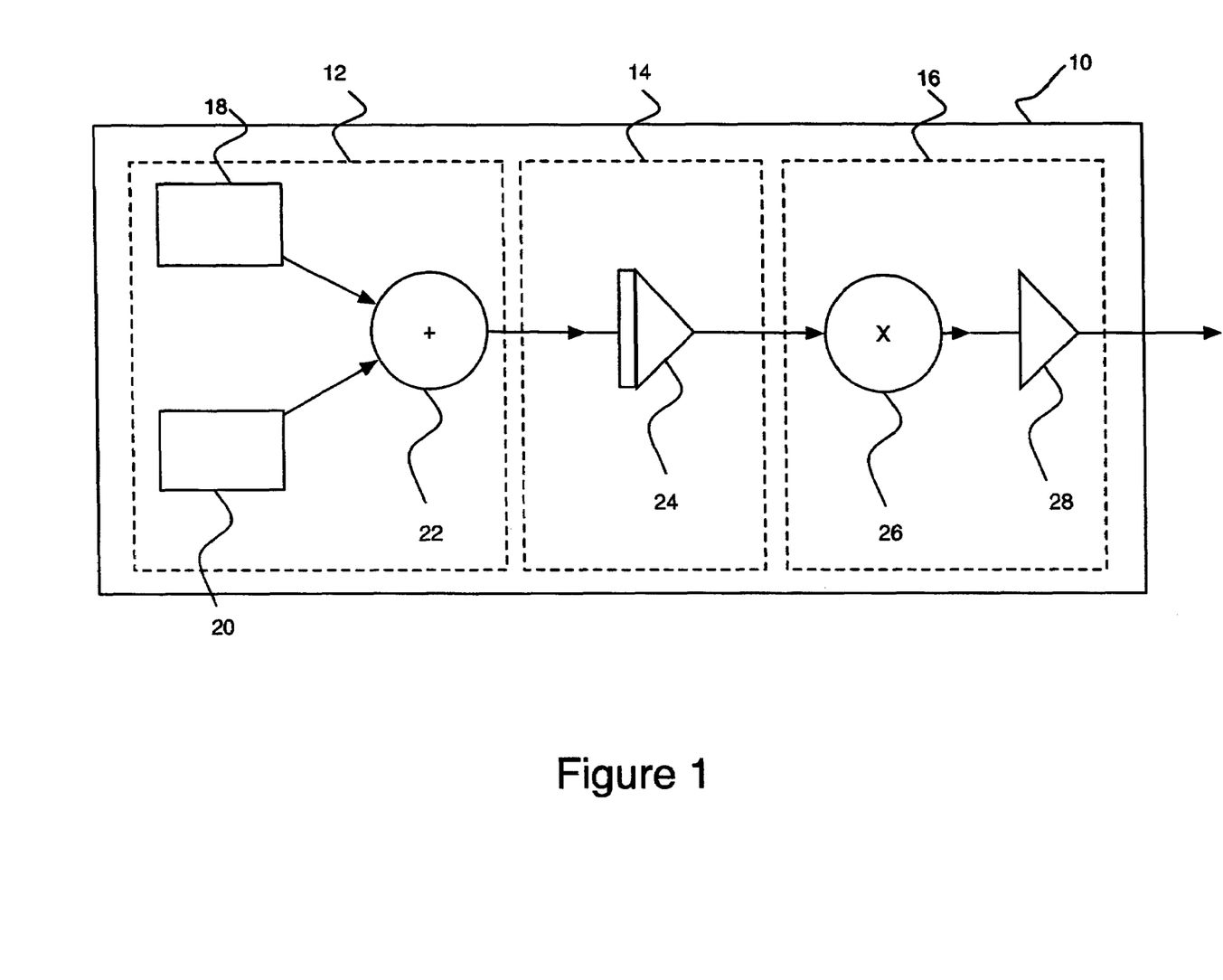
FIG. 1 is a block diagram of a linear amplifier.

As shown in FIG. 1, the present disclosure contemplates a linear amplification system 10 comprising a signal combining segment 12 coupled to a signal conversion segment 14, and a signal amplification segment 16 coupled to the signal conversion segment 14. One or more digital signals may enter signal combining element 12 and may be combined into a digital combination signal. A digital combination signal may be transmitted into the signal conversion segment 14 and may be converted into a combined analog signal. The combined analog signal then may be transmitted into the signal amplification segment 16 where it is frequency converted and amplified. In this system, multiple digital signals may be used as input signals, combined, converted into the analog domain, and then amplified. By converting the digital signals into analog signals, the converted signals may be combined and amplified without unacceptable signal degradation while using moderate to low performance digital to analog (DAC) units. However, it is expressly understood that high performance DAC units could be used to provide higher levels of system performance. In addition, the dynamic range of the system 10 may be increased through the use of an analog signal which permits multicarrier output at high power ranges.

In some embodiments, signal combining segment 12 is capable of taking a first signal 18 and a second signal 20 and combining the two signals by using a signal combining device 22. Signal combining device 22 is any device capable of taking one or more input signals and combining the signals to form an output signal from which the input signals may be recovered. It is contemplated that first signal 18 and second signal 20 may be any kind of digital signal, including, but not limited to, signals compatible with any one or more of the following communications standards: global system for mobile communications (GSM), enhanced data rates for GSM evolution (EDGE), universal mobile telecommunications System (UMTS), code division multiple access (CDMA), WiMAX (IEEE §§802.16d and 802.16e), IEEE §802.20, 3GPP, 3GPP2, LTE, or any other type of digital signal. It is further expressly contemplated that the first signal 18 and second signal 20 may be of dissimilar digital types (e.g., first signal 18 may be a GSM compatible signal and second signal 20 may be a UMTS compatible signal). This combination may be done in any way known in the art, including, but not limited to, time domain combining and frequency domain combining.

Signal conversion segment 14, in some embodiments, comprises independent DAC 24 that converts the digital combined signal an analog combined signal. In one embodiment, independent DAC 24 is illustrated as the unit that performs the digital to analog conversion, however it is expressly understood that any device capable of performing a digital to analog conversion may be used and that in other embodiments additional DAC units may be used. It is further understood that in other embodiments, any number of signal conversion and modification devices, such as predistortion devices, may be used consistent with this disclosure to enhance system 10.

In the embodiment illustrated by FIG. 1, signal amplification segment 16 comprises an up-conversion mixer 26 and an amplifier 28. Up-conversion mixer 26 received input from the signal conversion segment 14 and performs a conversion, including, but not limited to a base-band radio frequency (RF) up-conversion to the signal, and outputs this up-converted signal into amplifier 28. It is expressly understood that in this, and other embodiments, mixers (e.g., up-conversion mixer 26) may have an additional inputs, such as a carrier frequency inputs. Amplifier 28 amplifies the up-converted signal and outputs an amplified signal that then is transmitted out of system 10.

Figure 2:
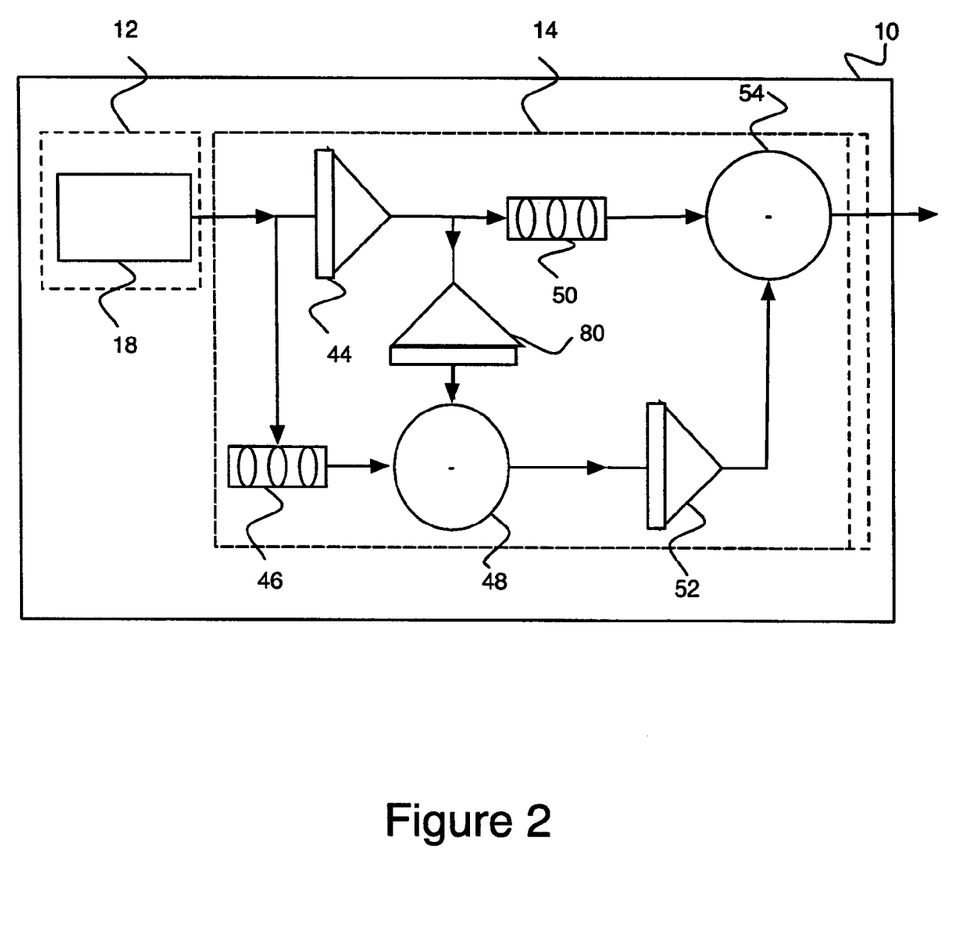
FIG. 2 is a block diagram of a system showing a digital feedforward device.

One of the innovative elements of system 10 is the use of feedforward principles that may be applied to linearize a digital to analog converter (DAC) output in a signal conversion segment 14 is illustrated in FIG. 2. In this embodiment, a sample of input signal 18 is taken and fed into first delay element 46 and first DAC 44. The output from first DAC 44 is split and fed into second delay element 50 and through analog to digital converter 80 (ADC) 80 into first signal subtraction module 48. The output from first delay element 46 is also fed into first signal subtraction module 48. First signal subtraction module 48 subtracts the output of the first DAC 44 from the output of the first delay element 46. The output from the first signal subtraction module 48 is fed into a second DAC 52, and subsequently fed into the second signal subtraction module 54. The output from the second delay element 50 is also fed into the second signal subtraction module 54. The output from second DAC 52 is subtracted from the output of the second delay element 50 in second signal subtraction module 54 and results in the analog version of input signal 18. Through this approach, scalar or complex signals may be amplified. Although this example is limited to a single input, it is expressly understood that this approach may be applied to a complex set of signals that may be found in signal combining segment 12.

Figure 3:
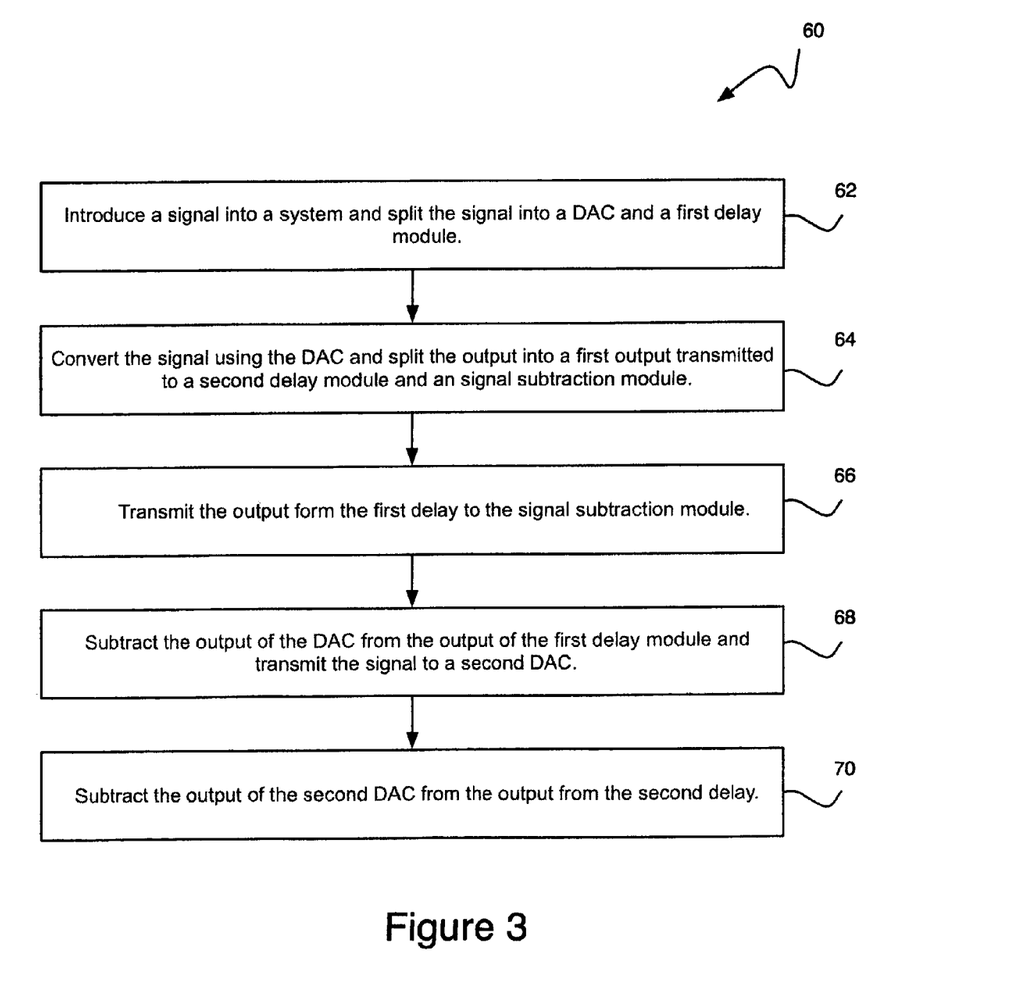
FIG. 3 is a flowchart of using a digital feedforward.

FIG. 3 is a flowchart 60 of the embodiment of system 10 illustrated by FIG. 2. In this embodiment a signal is introduced into system 10 and split into a DAC and a first delay module (Block 62). The input signal is converted using the DAC, and the output from the DAC is split into a first output transmitted to a second delay module and a signal subtraction module (Block 64). The output from the first delay is transmitted to the signal subtraction module (Block 66). The output of the DAC is subtracted from the output of the first delay module. The result of this subtraction is transmitted to a second DAC (Block 68). The signal from the second DAC is subtracted from the output from the second delay to form the output signal (Block 70).

Figure 4:
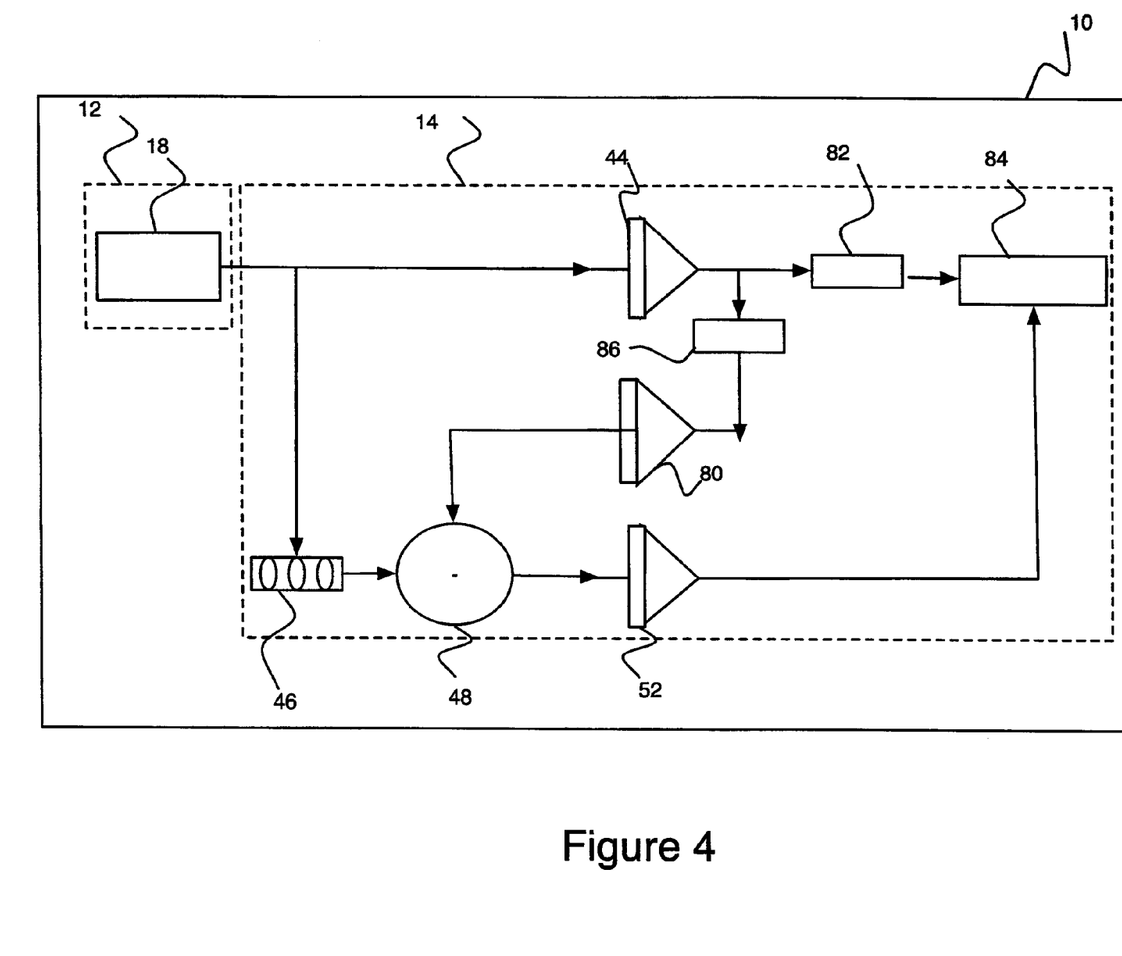
FIG. 4 is another block diagram of a linear amplifier using digital feedforward.

Another of the innovative elements of the present disclosure is the use of feedforward principles that may be applied to linearize a digital to analog converter (DAC) output in a signal conversion segment 14 as illustrated in FIG. 4. In this embodiment, a sample of input signal 18 found in signal combining segment 12 is taken and fed into first delay element 46 and first DAC 44. The output from first DAC 44 is split and fed into first filter 82 and through a second filter 86 into first analog to digital converter (ADC) 80. The output from first ADC 80 and the output from first delay element 46 are fed into first signal subtraction module 48. First signal subtraction module 48 subtracts the output of the first ADC 80 from the output of the first delay element 46. The first delay 46 may be set to the delay created by sum of the delay created by first DAC 44 and the additional ADC anti-alias filter. The output from the first signal subtraction module 48 is fed into a second DAC 52, and subsequently fed into the first signal combiner 84. The output from first filter 82 is also fed into first signal combiner 84. Signal combined 84 combines the signal input and creates an accurate representation of input signal 18.

In the embodiment illustrated by FIG. 4, signal combiner 84 combines the signal output from the first filter 82 and the second DAC 52 and creates an accurate representation of input signal 18. It is expressly understood that signal combiner 84 may be resistive or reactive, and the embodiment of system 10 illustrated by FIG. 4 may be implemented with scalar or complex signals. The phrase "signal combiner" is intended to refer to the mechanism by which two or more signals are combined into a single signal.

The first filter 82 and second filter 86 may be implemented in any way known to one skilled in the art. The first filter 82 and second filter 86, in some embodiments, may be implemented as anti-alias filters. The phrase anti-alias filters is intended to refer to the class of filters used to provide a cutoff frequency that removes unwanted signals from ADC input or at least attenuates them to the point that they will not adversely affect the circuit. Therefore, an anti-aliasing filter may be a low-pass filter which removes the unwanted signals from ADC input based upon the amount of attenuation (or ripple) in the pass band, the desired filter roll off in the stop band, the steepness in the transition region and the phase relationship of the different frequencies as they pass through the filter in any way known to one skilled in the art.

Figure 5:
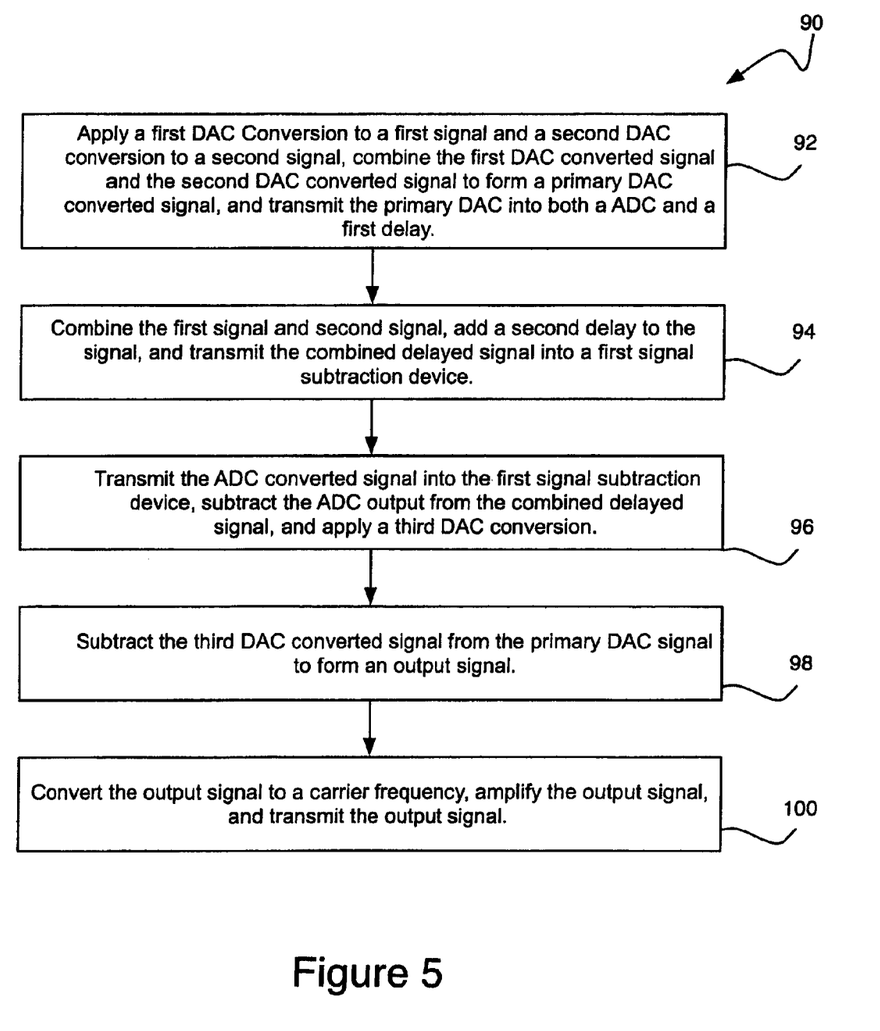
FIG. 5 is a flowchart of one method of operating a linear amplifier using digital feedforward.

One of the innovative approaches disclosed is the combination of multiple digital signals in the analog domain. FIG. 5 is a flowchart 90 of one process of combining multiple signals using multiple DAC units, where a third DAC unit is used for correction purposes. In this embodiment, a first DAC conversion is applied to a first signal and a second DAC conversion is applied to a second signal, and the first DAC converted signal and the second DAC converted signal are combined to form a primary DAC converted signal. The primary DAC is transmitted into both an ADC and a first delay (Block 92). The first signal and second signal may again be combined with a second delay added to the signal, and then transmitted into a first signal subtraction device (Block 94). The ADC converted signal is then transmitted into the first signal subtraction device, and the ADC output is subtracted from the combined delayed signal, and third DAC conversion is preformed (Block 96). Another element of this implementation is the subtraction of the third DAC converted signal from the primary DAC signal to form an output signal (Block 98). After the output signal is formed, this signal is then converted to a carrier frequency, amplified, and transmitted (Block 100).

Figure 6:
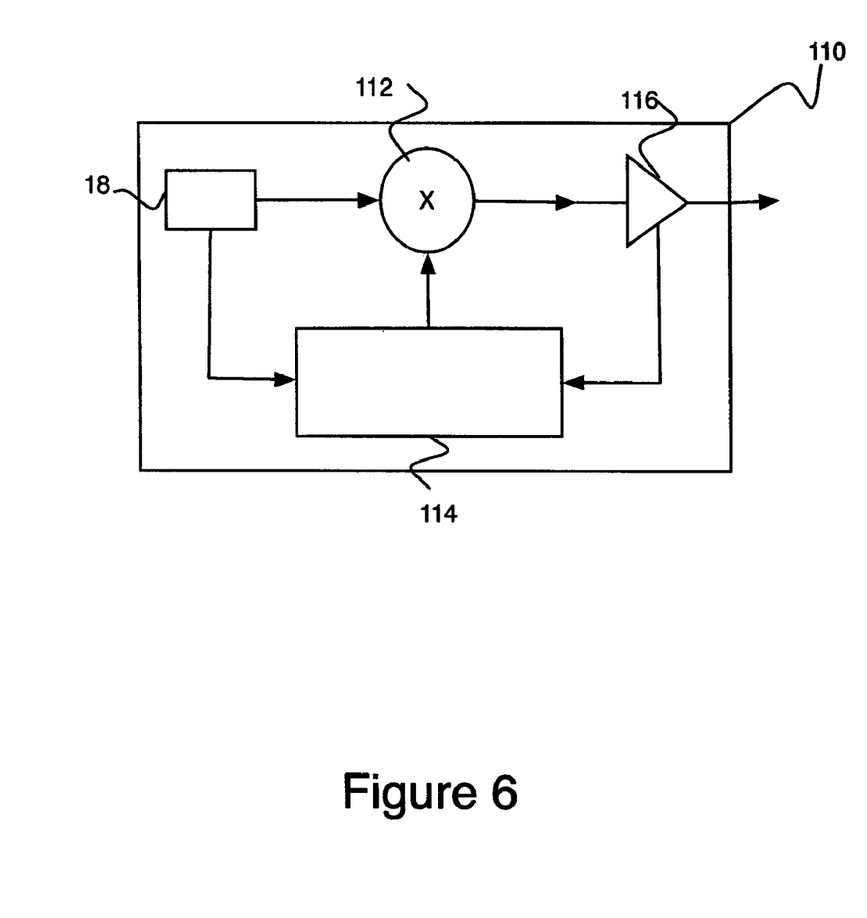
FIG. 6 is a block diagram of a predistortion unit.

FIG. 6 is an illustration of a predistortion unit 110. Predistortion is an alternative amplifier linearization technique where amplifier 116 is used to provide an output signal at an appropriate power. It is understood that in some embodiments this technique may be non-linear. This feedforward linearization provides the required linearity, but reduces system efficiency significantly. This linearization can be performed in the digital domain, the analogue domain, or a combination of the digital and analogue domains.

In the embodiment shown FIG. 6, an input signal 18 fed to amplifier 116 through actuator 112. Amplifier 116 amplifies and distorts actuator 112 output. Amplifier 116 output is sampled and fed to digital predistortion engine (DPE) 114. DPE 114 compares the input signal 18 with the output from amplifier 116. DPE 114 performs this comparison by determining the inverse transfer function of amplifier 116 and perturbs the actuator so that DPE 114 output is a predistorted version of the input signal 18. Therefore, when the predistorted signal from PDE 114 is applied to the signal from amplifier 116 this output should be the same as the input signal 18. The DPE attempts to minimize the errors in amplifier 116 output.

Figure 7:
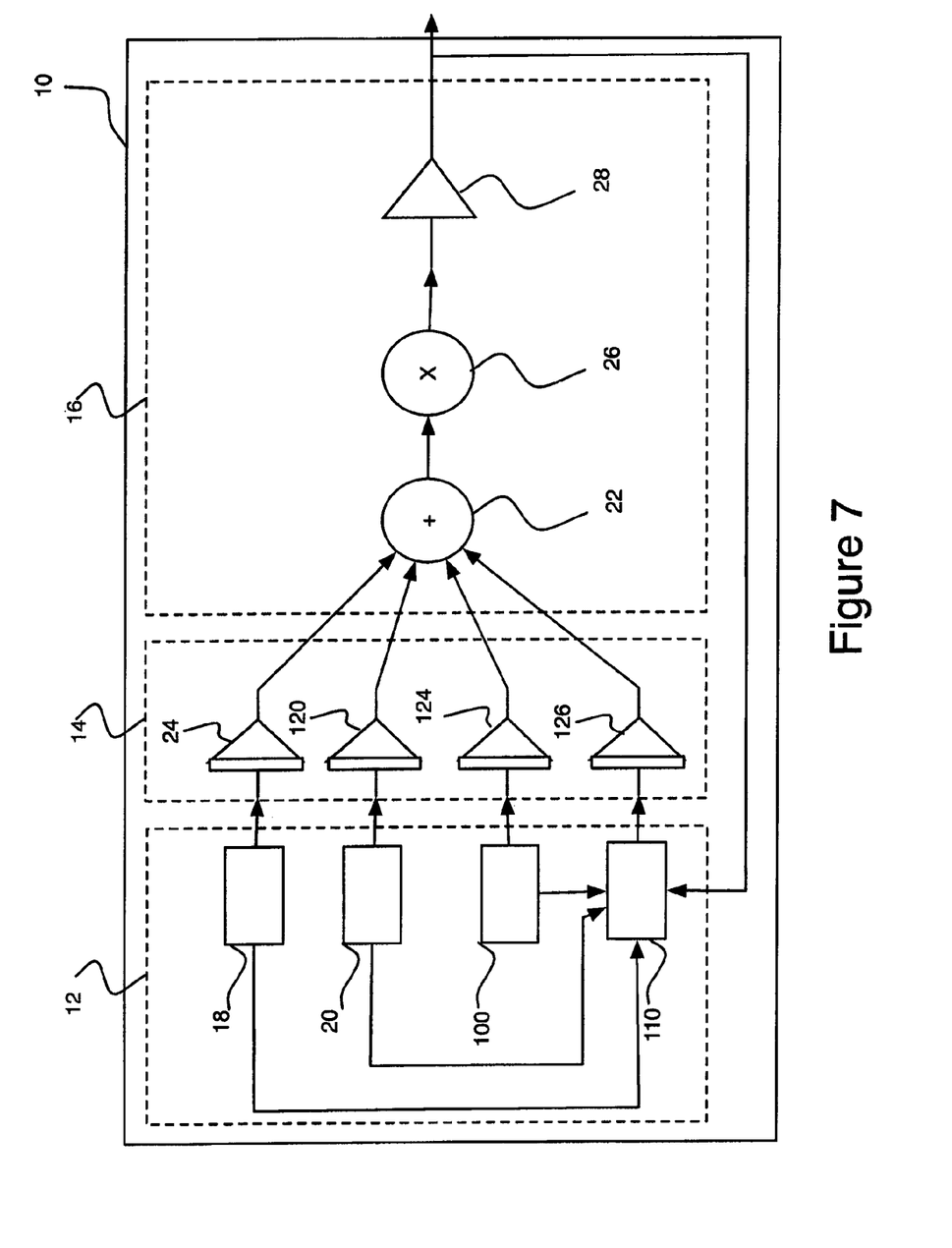
FIG. 7 is a block diagram of a linear amplifier using digital feedforward where multiple inputs are transmitted into multiple DAC units.

FIG. 7 is an illustration of a system 10 using predistortion unit 110. In this embodiment, signal-combining segment 12 comprises first input 18, second input 20, a third input 100, and predistortion unit 110. First input 18 transmits an input signal into first DAC 24 and predistortion unit 110. Second input 20 transmits an input signal into second DAC 120 and predistortion unit 110. Third input 100 transmits an input signal into third DAC 124 and predistortion unit 110. Predistortion unit 110 accepts input from the first input 18, second input 20, third input 100, and the output from system 10, and outputs a signal into fourth DAC 126.

Signal conversion segment 14 illustrated in FIG. 7 comprises a first DAC 24, second DAC 120, third DAC 124, and fourth DAC 126. First DAC 24, second DAC 120, third DAC 124, and fourth DAC 126 all output a signal into signal combiner 22 the signal amplification segment 16. One of the innovations of the present disclosure is the ability to combine several DAC outputs in the analog domain (e.g., baseband or low power RF). In addition, the present innovation uses a separate correction DAC, in this embodiment shown as the fourth DAC 126, to linearize the DAC outputs. In addition, the correction DAC can be used, in some embodiments, to linearize the analog transmission chain, including the power amplifier. Another advantage is that the combination various digital signals may take place after the digital signal has been converted to analog, and that lower performance DAC units (e.g., units within about 450 MHz to about 3.5 GHz) may be used.

In the embodiment illustrated by FIG. 7, signal amplification segment 16 comprises signal combiner 22, up-conversion mixer 26, and an amplifier 28. Up-conversion mixer 26 received input from signal combiner 22 and performs a baseband radio frequency (RF) up-conversion to the signal, and outputs this up-converted signal into amplifier 28. Amplifier 28 amplifies the up-converted signal and outputs an amplified signal that then is transmitted out of system 10. Unlike the embodiment illustrated in FIG. 1, the combination of the analog signals occurs after the digital input signal has been converted to an analog signal.

Figure 8:
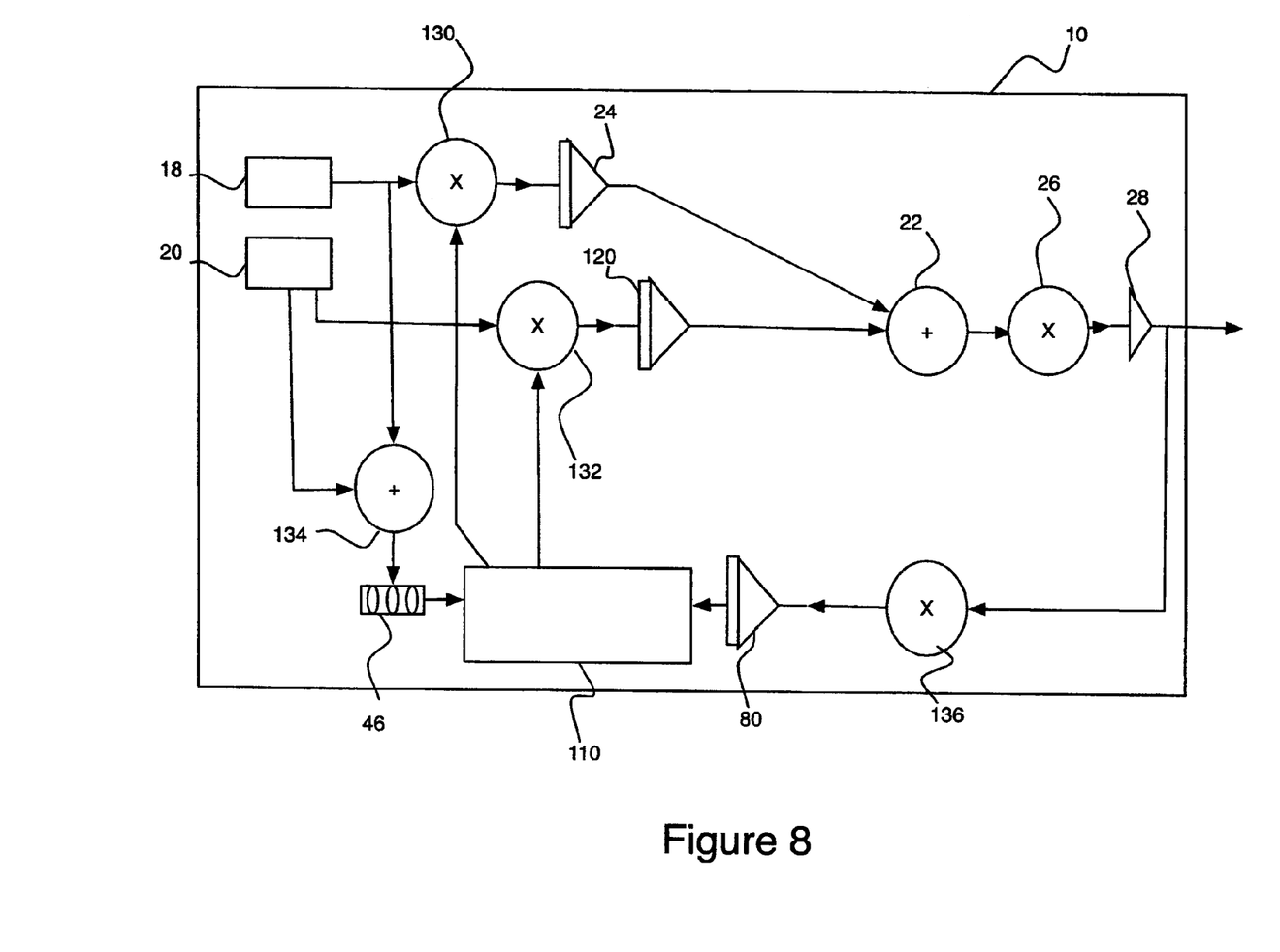
FIG. 8 is a flowchart of one method of operating a linear transmitter using multiple digital actuators.

FIG. 8 is another embodiment of a system 10 using multicarrier predistortion. This example, and in further examples, the delineations between different segments used previously have been removed for the sake of clarity, and the lack of a specific reference in these subdivisions should not be interpreted to be a limitation on this, or any other, embodiment. In the embodiment shown in FIG. 8, first input signal 18 is transmitted into second signal combiner 134 and first digital actuator 130. Second input signal 20 is transmitted into second signal combiner 134 and second digital actuator 132. Second signal combiner 134 combines first input signal 18 and second input signal 20 into predistortion unit 110 through first delay element 46. The output from first digital actuator 130 is transmitted into first DAC 24. The output from second digital actuator 132 is transmitted into second DAC 120. The output from first DAC 24 and second DAC 120 are transmitted into up-conversion mixer 26 through first signal combiner 22. Up-conversion mixer 26 is used to convert the signal coming into the up-conversion mixer 26 into a carrier frequency. The output from up-conversion mixer 26 is transmitted into amplifier 28 and amplified.

The signal transmitted out of amplifier 28 is also transmitted back into system 10 through down-converter 136. Down-converter 136 down-converts the incoming signal and transmits the signal into ADC 80. ADC 80 converts the signal and transmits the analog signal into predistortion unit 110. Predistortion unit 110 accepts a signal from first delay element 46, ADC 80, performs a predistortion on the signal and sends a first predistorted output to first digital actuator 130 and a second predistorted output to second digital actuator 132.

It is expressly understood that equalizers, filtering, base band frequency shifts, and other elements known to one skilled in the art may be used in conjunction with the disclosed embodiment. It is further understood that other inputs, such as a first pilot tone and a second pilot tone may be used in conjunction with up-conversion mixer 26 and down-conversion mixer 136 respectively. In some embodiments, the up-conversion input may be used to enhance the effects of distortion techniques such as phase distortion.

Figure 9:
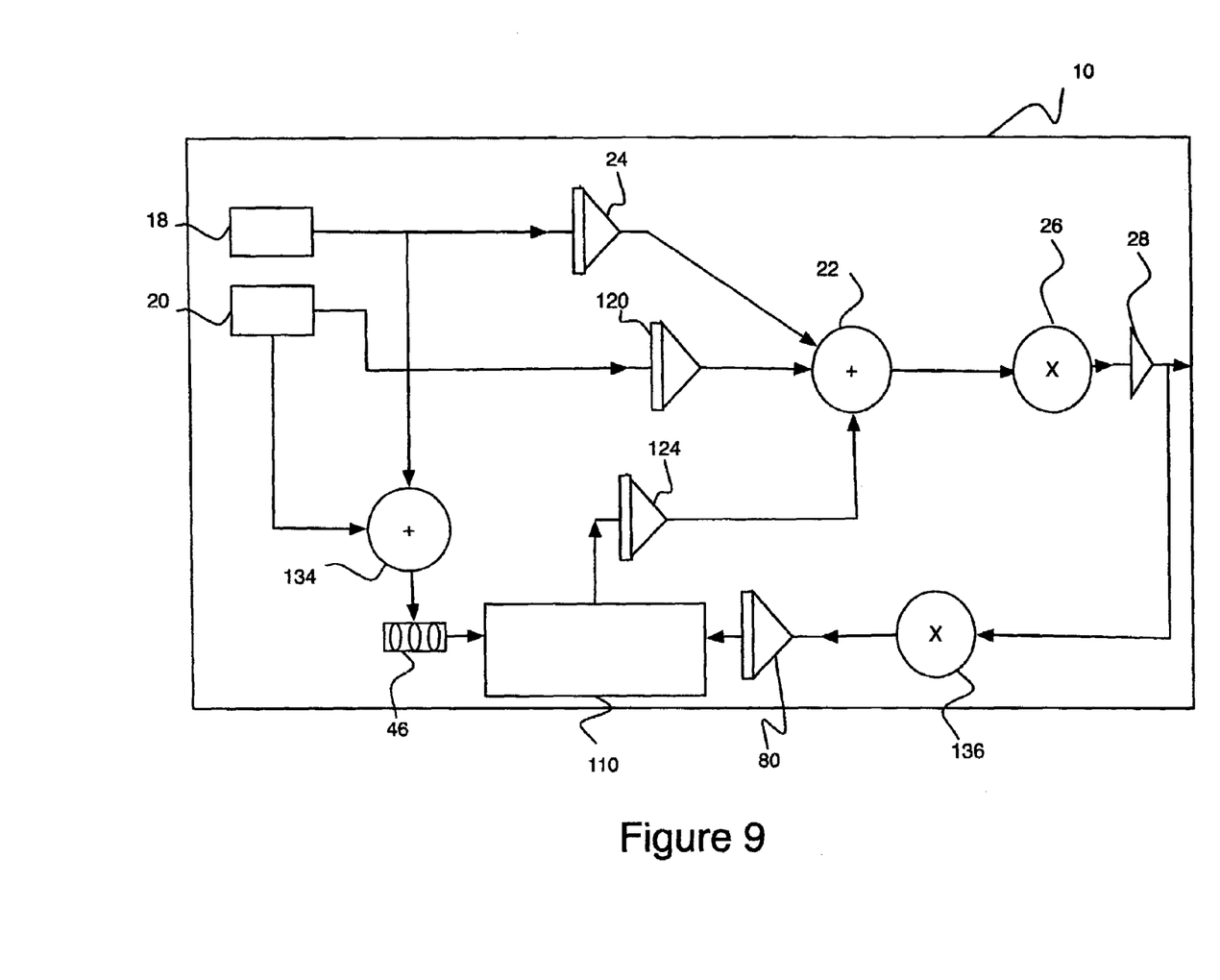
FIG. 9 is a flowchart of one method of operating a linear amplifier using analog predistortion.

FIG. 9 is substantially similar to FIG. 8, with the exception that FIG. 9 contains direct connections between first input signal 18 and first DAC 24, second input 20 and second DAC 120, and does not contain from first digital actuator 130 and second digital actuator 132. In addition, FIG. 9 contains third DAC 124 that accepts first predistorted signal from predistortion unit 110, converts the signal, and transmits the signal to signal combiner 22. Predistortion unit 110 predistorts the input signal in the analog domain, prior to up-conversion. Third DAC 124 also provides for an error signal that corrects for imperfections in first DAC 24, second DAC 120, up-converter 26, and amplifier 28, and can be implemented as illustrated in FIG. 8 or as separate modules that multiply could be used, such as amplitude and phase modulators. Predistortion unit 110, in some embodiments, further may be used to account for time delays or other signal effects within system 10. Signal combiner 22, in addition to combining the output of the first DAC 24 and second DAC 120 also predistorts the combined signal using the output from third DAC 124.

Figure 10:
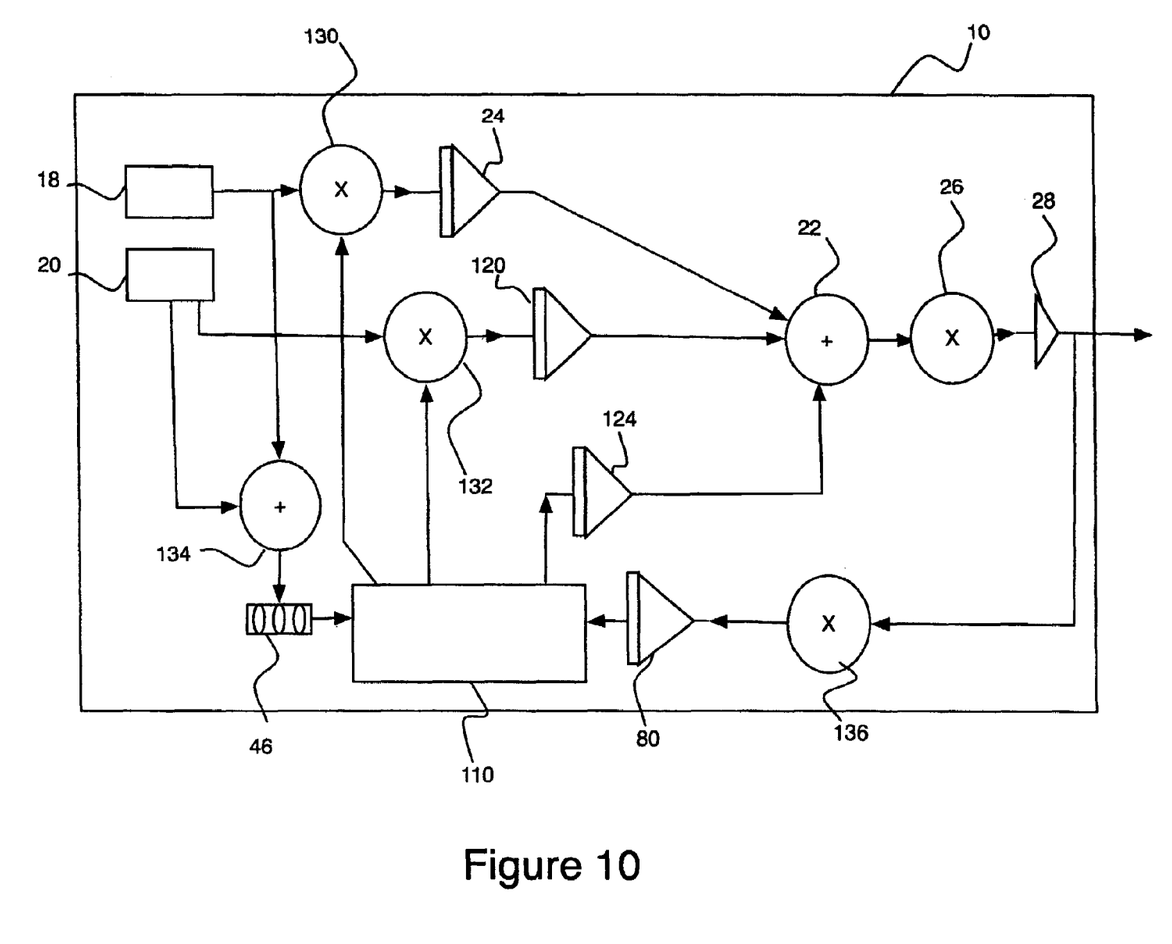
FIG. 10 is a flowchart of one method of operating a linear amplifier using an analogue predistortion and multiple digital actuators.

FIG. 10 is an illustration of another embodiment of system 10 used for multicarrier predistortion. This embodiment is a combination of all of the embodiments illustrated in FIG. 8 and FIG. 9. One of the innovative features of this embodiment is combination of the first digital actuator 130, second digital actuator 132, and third DAC 124. Through this combination, the output of system 10 can be enhanced.

Figure 11:
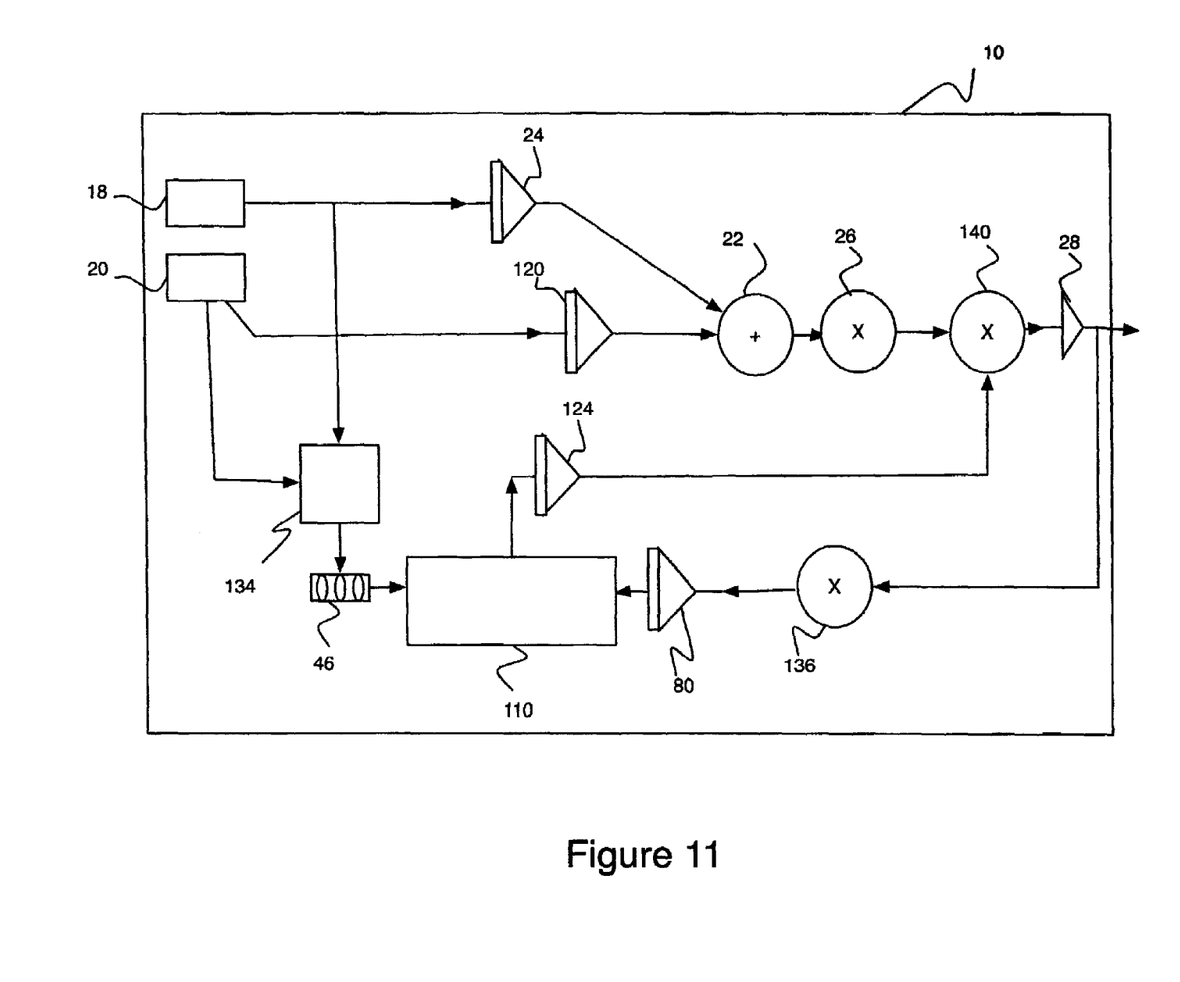
FIG. 11 is a block diagram of a predistortion unit used in a signal generation unit where predistortion is preformed after a signal frequency conversion.

FIG. 11 is yet another of system 10 using multicarrier predistortion. FIG. 11 is substantially similar to the embodiment illustrated in FIG. 9, except that the output from the third DAC 124 does not transmit any signals into signal combiner 22, and does transmit a signal into a predistortion mixer 140 that is placed in series in between up-conversion mixer 26 and amplifier 28. In this embodiment, the predistortion is preformed by predistortion mixer 140 in the analog domain and is performed after up-conversion by up-conversion mixer 26. Third DAC 124 also provides for an error signal that corrects for imperfections in first DAC 24, second DAC 120, up-converter 26, and amplifier 28, and can be implemented as illustrated in FIG. 11 or separate modules that multiply could be used such as amplitude and phase modulators. In addition, in the embodiment illustrated by FIG. 11, since the predistortion mixer occurs after up-conversion, the third DAC 124 may, in some embodiments, be used to predistort at radio frequencies (RF) using any method known to one skilled in the art, including, but not limited to magnitude and phase modulators. It is further understood that the inputs to first up-conversion mixer 26 and down-converter 136 may be used to perform some methods of predistortion, such as phase predistortion.

Figure 12:
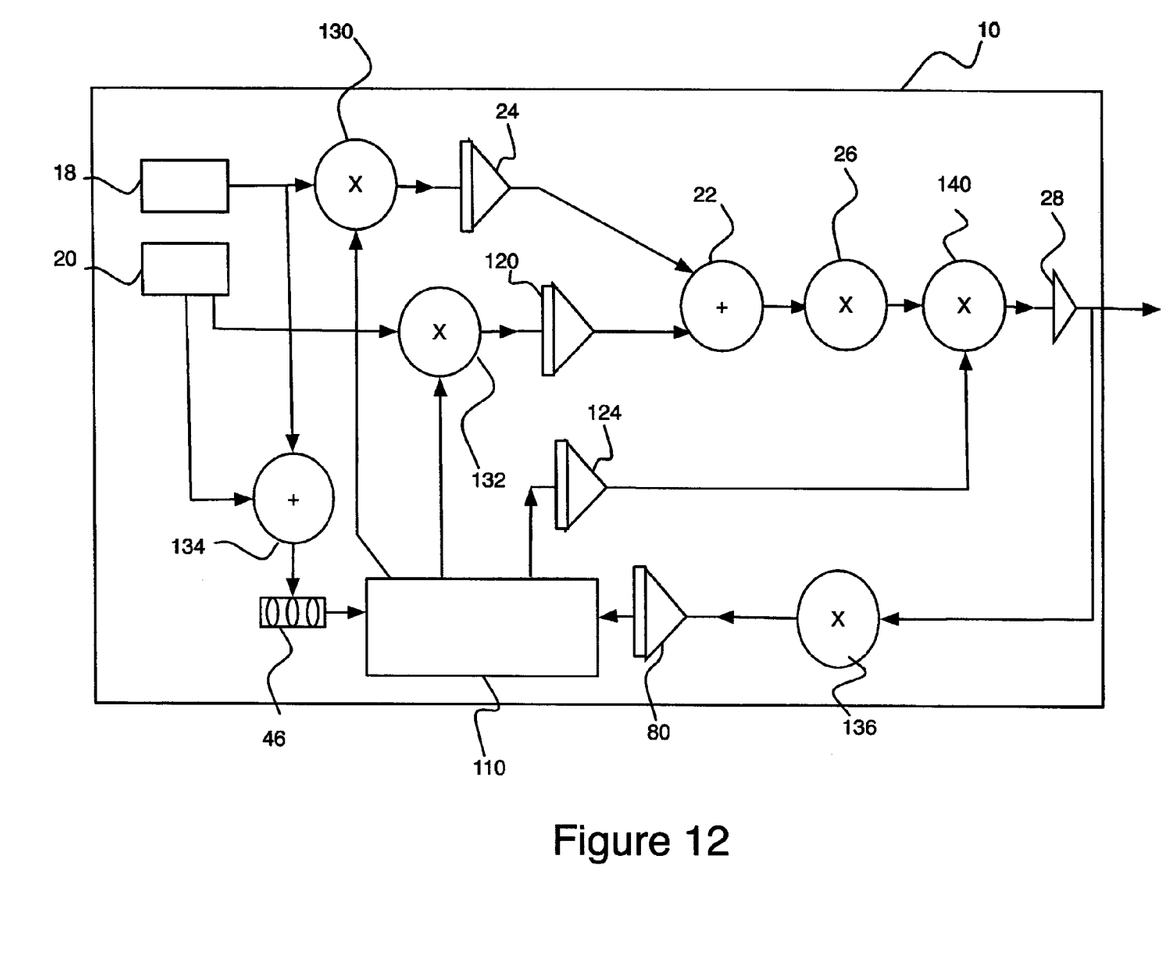
FIG. 12 is a block diagram of a predistortion unit used in a signal generation unit where predistortion is preformed after a signal frequency conversion and using multiple digital actuators.

FIG. 12 is an illustration of another embodiment of system 10 used for multicarrier predistortion. This embodiment is a combination of all of the embodiments illustrated in FIG. 8 and FIG. 11. One of the innovative features of this embodiment is combination of the first digital actuator 130, second digital actuator 132, third DAC 124, and predistortion mixer 140. Through this combination the output of system 10 can be enhanced.

Figure 13:
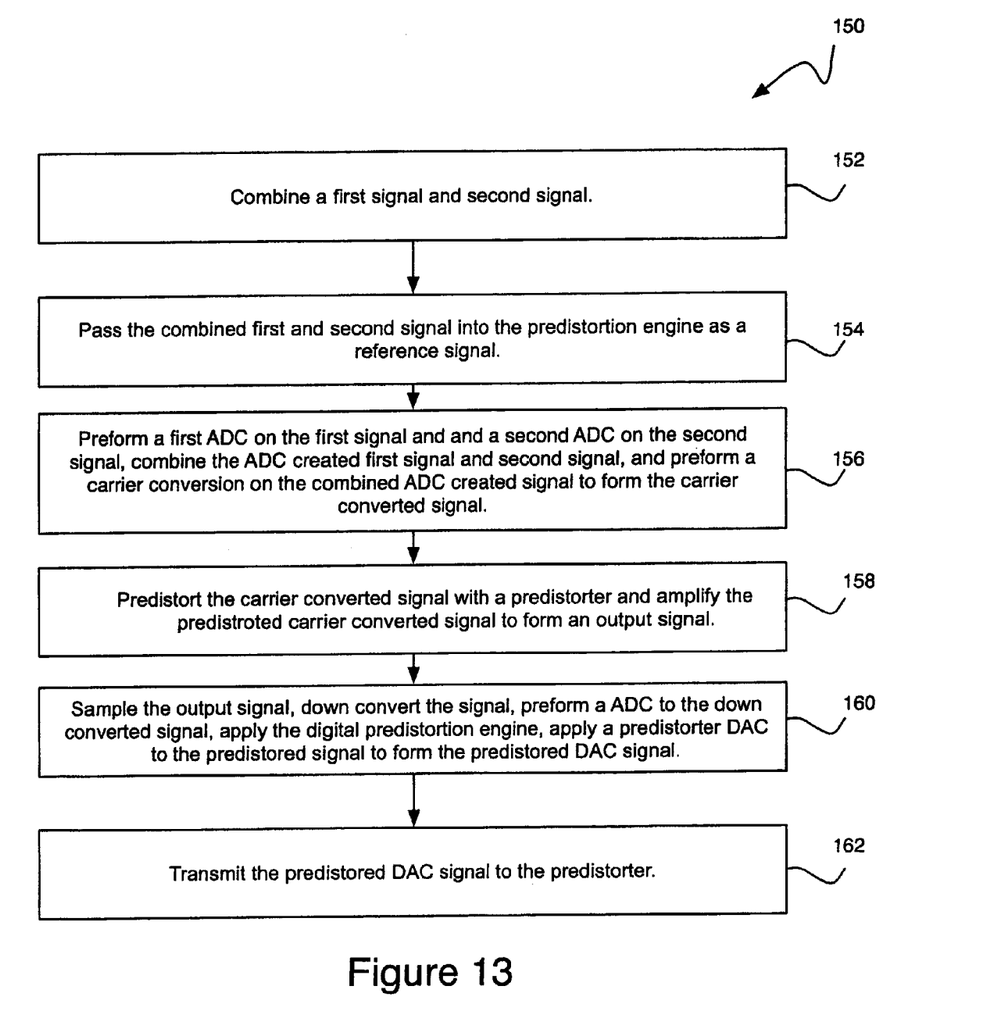
FIG. 13 is a flowchart of using a predistortion unit.

FIG. 13 is a flowchart of one method of multicarrier predistortion 150. In this embodiment, a first signal and second signal are combined (Block 152). The combined first and second signals are passed into the predistortion engine as a reference signal (Block 154). A first ADC is preformed on the first signal and a second ADC is preformed on the second signal. The ADC created first signal and second signal are combined, and a carrier conversion is preformed (Block 156). The carrier-converted signal is predistorted with a predistorter. The predistorted carrier-converted signal is amplified to form an output signal (Block 158). The output signal is sampled, down-converted and an ADC is preformed. A digital predistortion engine is used to create a predistorted DAC signal (Block 160). The predistorted DAC signal is transmitted to the predistorter (Block 162).

Figure 14:
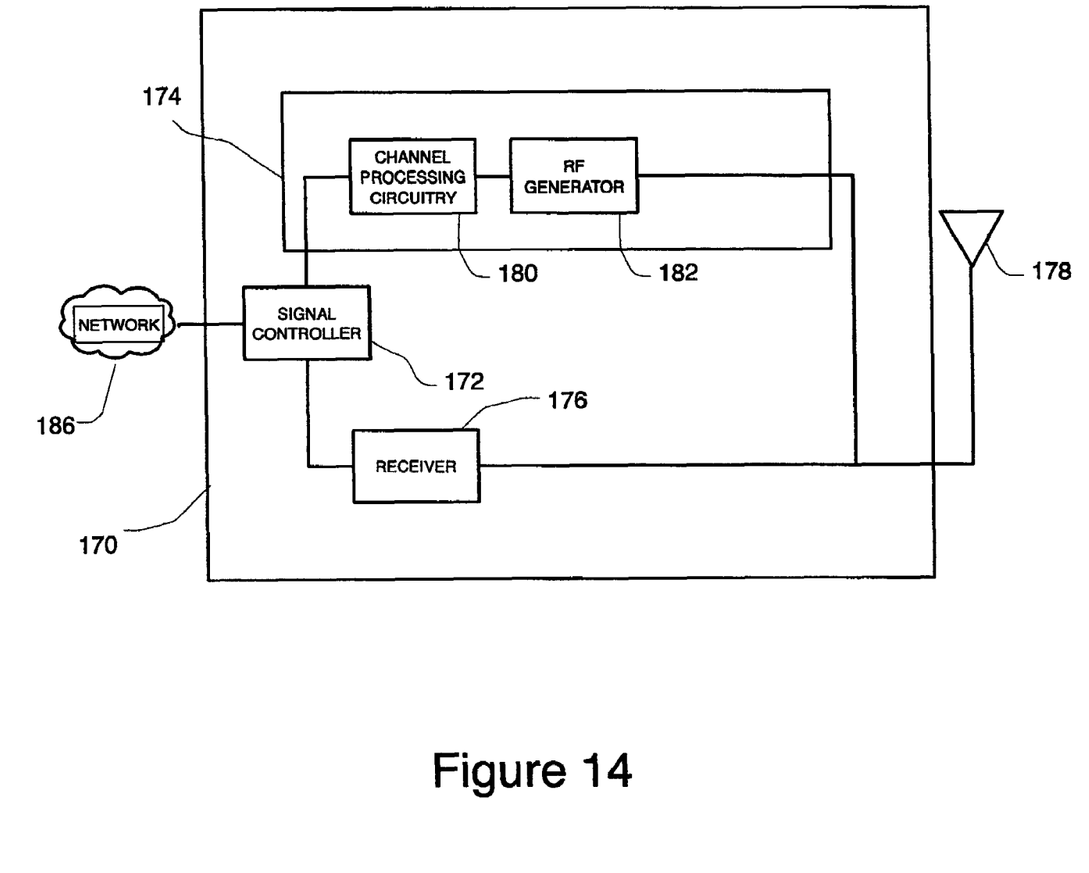
FIG. 14 is a block diagram of a base station unit.

As shown in FIG. 14, disclosed system 10 design may be incorporated as signal controller 172 into a base station 170. Base station 170 is a medium to high-power multi-channel, two-way radio in a fixed location. Typically it may be used by low-power, single-channel, two-way radios or wireless devices such as mobile phones, portable phones and wireless routers. Base station 170 may comprise a signal controller 172 that is coupled to a transmitter 174 and a receiver 176. Transmitter 174 and receiver 176 (or combined transceiver) is further coupled to an antenna 178. In base station 170, digital signals are processed in signal controller 172. The digital signals may be signals for a wireless communication system, such as signals that convey voice or data intended for a mobile terminal (not shown). Base station 170 may employ any suitable wireless technologies or standards such as 2G, 2.5G, 3G, GSM, IMT-2000, UMTS, iDEN, GPRS, 1xEV-DO, EDGE, DECT, PDC, TDMA, FDMA, CDMA, W-CDMA, LTE, TD-CDMA, TD-SCDMA, GMSK, OFDM, WiMAX, the family of IEEE §802.11 standards, the family of IEEE §802.16 standards, IEEE §802.20, etc. Signal controller 172 then transmits the digital signals to transmitter 174, which includes a channel processing circuitry 180. Channel processing circuitry 180 encodes each digital signal, and a radio frequency (RF) generator 182 modulates the encoded signals onto an RF signal. The resulting output signal is transmitted over antenna 178 to the mobile terminal. Antenna 178 also receives signals sent to base station 170 from the mobile terminal. Antenna 178 transmits the signals to receiver 176 that demodulates them into digital signals and transmits them to signal controller 172 where they may be relayed to an external network 186. Base station 170 may also comprise auxiliary equipment such as cooling fans or air exchangers for the removal of heat from base station 170.

In an embodiment, one or more embodiments of system 10 may be incorporated into base station 170 in lieu of parts, if not all, of blocks 182, which may decrease the capital costs and power usage of base station 170. The power amplifier efficiency measures the usable output signal power relative to the total power input. The power not used to create an output signal is typically dissipated as heat. In large systems such as base station 170, the heat generated in may require cooling fans and other associated cooling equipment that may increase the cost of base station 170, require additional power, increase the overall size of the base station housing, and require frequent maintenance. Increasing the efficiency of base station 170 may eliminate the need for some or all of the cooling equipment. Further, the supply power to system 10 may be reduced since it may more efficiently be converted to a usable signal. The physical size of base station 170 and the maintenance requirements may also be reduced due to the reduction of cooling equipment. This may enable base station 170 equipment to be moved to the top of a base station tower, allowing for shorter transmitter cable runs and reduced costs. In an embodiment, base station 170 has an operating frequency ranging from about 450 MHz to about 3.5 GHz.

While preferred embodiments of the invention have been shown and described, modifications thereof can be made by one skilled in the art without departing from the spirit and teachings of the invention. The embodiments described herein are exemplary only, and are not intended to be limiting. Many variations and modifications of the invention disclosed herein are possible and are within the scope of the invention. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). Use of broader terms such as "comprises", "includes", "having", etc. should be understood to provide support for narrower terms such as "consisting of", "consisting essentially of", "comprised substantially of", etc.

Accordingly, the scope of protection is not limited by the description set out above but is only limited by the claims which follow, that scope including all equivalents of the subject matter of the claims. Each and every claim is incorporated into the specification as an embodiment of the present invention. Thus, the claims are a further description and are an addition to the preferred embodiments of the present invention. The discussion of a reference in the Description of Related Art is not an admission that it is prior art to the present invention, especially any reference that may have a publication date after the priority date of this application. The disclosures of all patents, patent applications, and publications cited herein are hereby incorporated by reference, to the extent that they provide exemplary, procedural or other details supplementary to those set forth herein.

The invention claimed is:

1. A signal amplification system, comprising:
    a plurality of digital signal inputs coupled to a signal combination device, wherein each of the plurality of digital signal inputs correspond to a separate digital signal;
    a signal conversion device coupled to the signal combination device;
    an up-conversion device coupled to the signal conversion device; and
    an amplification unit coupled to the up-conversion device; wherein the plurality of signals are combined into a combined digital signal in the signal combination device, the combined digital signal is converted into a combined analog signal in the signal conversion device, the combined analog signal is up-converted into an up-converted analog signal in the up-conversion device, and the up-converted analog signal is amplified into an amplified output in the amplification device.

2. The amplification unit of claim 1 wherein the plurality of digital signals are selected from the group of GSM, UMTS, CDMA, LTE, WiMAX, EDGE, IEEE §802.11 family of standards, IEEE § 802.16 family of standards, IEEE §802.20, or any combination of the foregoing.

3. The amplification unit of claim 1, wherein the output from the signal combination device is the substantial digital equivalent of the output from the amplification device.

4. The amplification unit of claim 1, further comprising a plurality of signal conversion devices, wherein each digital signal input is connected to a separate signal conversion device.

5. The amplification unit of claim 4, further comprising an analog to digital conversion device, wherein analog to digital conversion device converts at least one signal from analog to digital, and wherein this signal connected to the output of the amplifier and coupled to the up-conversion mixer.

6. The amplification unit of claim 4, further comprising a predistortion unit.

7. The amplification unit of claim 4, further comprising a digital actuator.

8. The amplification unit of claim 5, wherein an anti-aliasing filter is coupled to the inverted signal conversion device.

9. The amplification unit of claim 5, further comprising a predistortion unit coupled to the inverted signal conversion device and the up-conversion mixer.

10. The amplification unit of claim 9, wherein a down-conversion mixer is coupled to the output of the amplifier device and an input to the predistortion unit.

11. The amplification unit of claim 10, wherein the up-conversion mixer has at least one additional input; and wherein at least one addition input is used for phase predistortion.

12. A method of amplifying a plurality of input signals comprising:
    converting a plurality of digital signals to a plurality of analog signals, wherein each of the plurality of digital signal inputs correspond to a separate digital signal;
    combining the plurality of analog signals into a combined analog signal;
    preparing the combined analog signal for amplification; and
    amplifying the prepared combined analog signal.

13. The method of amplifying a plurality of input signals of claim 12, wherein preparing the combined analog signal comprises predistorting the combined analog signal into a predistorted combined analog signal.

14. The method of amplifying a plurality of input signals of claim 12, wherein preparing the combined analog signal comprises up-converting the combined analog signal into an up-converted combined analog signal.

15. The method of amplifying a plurality of input signals of claim 13, further comprising modifying the prepared combined analog signal with the predistorted combined analog signal.

16. A system for amplification, comprising:
    a plurality of digital to analog conversion devices with a plurality of digital signals inputs coupled to a signal combiner, wherein each of the plurality of digital signal inputs correspond to a separate digital signal;
    a conversion mixer coupled to the signal combiner; and
    an amplifier coupled to the conversion mixer, wherein the plurality of digital signals are converted into a plurality of analog signals, the plurality of analog signals are combined concurrently into a single analog signal, the analog signal is converted in the conversion mixer onto a carrier frequency, and the converted analog signal is amplified.

17. The system of claim 16, further comprising an error correction forward feedback loop.

18. The system of claim 17, wherein the forward feedback loop contains at least one predistortion unit.

19. The system of claim 17, wherein the error correction forward feedback loop contains at least one actuator.

20. The system of claim 18, wherein the predistortion unit contains inputs for the plurality of digital signals and the output analog signal.

* * * * *